(12) United States Patent
Pihl

(10) Patent No.: US 11,073,014 B2
(45) Date of Patent: Jul. 27, 2021

(54) CASED FORMATION PARAMETER DATA SAMPLING EMPLOYING AN IMPEDANCE MATCHING DIRECTIONAL COUPLING DEVICE

(71) Applicant: Halliburton Energy Services, Inc., Houston, TX (US)

(72) Inventor: Joachim A. Pihl, Sandefjord (NO)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 16/228,021

(22) Filed: Dec. 20, 2018

(65) Prior Publication Data

US 2019/0284927 A1 Sep. 19, 2019

(30) Foreign Application Priority Data

Mar. 13, 2018 (WO) ................ PCT/US2018/022120

(51) Int. Cl.
| | |
|---|---|
| *E21B 47/13* | (2012.01) |
| *H01F 38/14* | (2006.01) |
| *H03H 7/38* | (2006.01) |
| *E21B 49/00* | (2006.01) |

(52) U.S. Cl.
CPC ............. *E21B 47/13* (2020.05); *H01F 38/14* (2013.01); *H03H 7/38* (2013.01); *E21B 49/00* (2013.01); *H01F 2038/143* (2013.01)

(58) Field of Classification Search
CPC .. E21B 47/122; E21B 49/00; H01F 2038/143; H01F 38/14; H03H 7/38
See application file for complete search history.

(56) References Cited

U.S. PATENT DOCUMENTS

| | | | | |
|---|---|---|---|---|
| 4,885,747 | A * | 12/1989 | Foglia | ................ H04L 12/4604 370/490 |
| 5,818,352 | A * | 10/1998 | McClure | ............... E21B 47/122 340/854.6 |
| 2013/0120093 | A1* | 5/2013 | Deville | ................. E21B 47/122 336/115 |
| 2013/0206387 | A1* | 8/2013 | Deville | .................. E21B 47/12 166/66.4 |
| 2013/0334894 | A1 | 12/2013 | Borgen | |
| 2015/0346752 | A1 | 12/2015 | Storm | |
| 2016/0090817 | A1 | 3/2016 | Ramos | |

* cited by examiner

*Primary Examiner* — Omer S Khan
(74) *Attorney, Agent, or Firm* — Scott Richardson; Parker Justiss, P.C.

(57) ABSTRACT

A downhole directional coupling device includes a downhole transformer arrangement having at least one transformer and a magnetically-coupled conductive coil structure that is electrically coupled to the downhole transformer arrangement and has first, second and third conductive coils positioned around a common axis. The first and second conductive coils are separated along the common axis and located inside the section of non-magnetic wellbore casing, and the third conductive coil shares an axial portion of the common axis with the second conductive coil and is located outside the section of non-magnetic wellbore casing. A method of employing a downhole directional coupling device in a wellbore having a section of non-magnetic casing and a logging system are also provided.

17 Claims, 9 Drawing Sheets

CASED FORMATION PARAMETER DATA SAMPLING EMPLOYING AN IMPEDANCE MATCHING DIRECTIONAL COUPLING DEVICE

CROSS-REFERENCE TO RELATED APPLICATION

This application claims the benefit of WO Application Serial No. PCT/US2018/022120, filed by Joachim A. Pihl on Mar. 13, 2018, entitled "CASED-FORMATION PARAMETER DATA SAMPLING EMPLOYING AN IMPEDANCE MATCHING DIRECTIONAL COUPLING DEVICE," commonly assigned with this application and incorporated herein by reference in its entirety.

TECHNICAL FIELD

This application is directed, in general, to data gathering and, more specifically, to a downhole directional coupling device, a method of employing a downhole directional coupling device and a logging system

BACKGROUND

This section introduces aspects that may help facilitate a better understanding of the inventions. Accordingly, the statements of this section are to be read in this light and are not to be understood as admissions about what is prior art or what is not prior art.

The use of a directional coupler has long been known in sending bidirectional signals on a single telephone circuit (e.g., a telephone hybrid) without them interfering with another. However, general use of this kind of directional coupler presents a major drawback in that a transmission line impedance needs to be matched by certain other local impedances, which is usually problematic in broader applications. This is particularly true in inductively powered downhole systems that are somewhat unpredictable in this area.

SUMMARY

In one aspect, the disclosure provides a downhole directional coupling device for use with a non-magnetic section of wellbore casing. In one example, the downhole directional coupling device includes: (1) a downhole transformer arrangement having at least one transformer, and (2) a magnetically-coupled conductive coil structure that is electrically coupled to the downhole transformer arrangement and has first, second and third conductive coils positioned around a common axis, wherein the first and second conductive coils are separated along the common axis and located inside the section of non-magnetic wellbore casing, and the third conductive coil shares an axial portion of the common axis with the second conductive coil and is located outside the section of non-magnetic wellbore casing.

In another aspect, the disclosure provides a method of employing a downhole directional coupling device in a wellbore having a section of non-magnetic casing. In one example, the method includes: (1) providing a downhole transformer arrangement, (2) providing a magnetically-coupled conductive coil structure that is electrically coupled to the downhole transformer arrangement and has first, second and third conductive coils positioned around a common axis, (3) separating the first and second conductive coils along the common axis within the section of non-magnetic wellbore casing, and (4) positioning the third conductive coil outside the section of non-magnetic wellbore casing and to share an axial portion of the common axis with the second conductive coil.

In yet another aspect, the disclosure provides a system. In one example, the system includes: (1) surface equipment that is electrically coupled to a communications link to provide operational support downlink and receive formation information uplink, and (2) a downhole directional coupling device electrically coupled to the communications link. The downhole directional coupling device including: (2A) a downhole transformer arrangement having at least one transformer, and (2B) a magnetically-coupled conductive coil structure that is electrically coupled to the downhole transformer arrangement and has first, second and third conductive coils positioned around a common axis, wherein the first and second conductive coils are separated along the common axis and located inside the section of non-magnetic wellbore casing, and the third conductive coil shares an axial portion of the common axis with the second conductive coil and is located outside the section of non-magnetic wellbore casing.

BRIEF DESCRIPTION

The embodiments of the disclosure are best understood from the following detailed description, when read with the accompanying Figures. Reference is now made to the following descriptions taken in conjunction with the accompanying drawings, in which.

Figure 7:
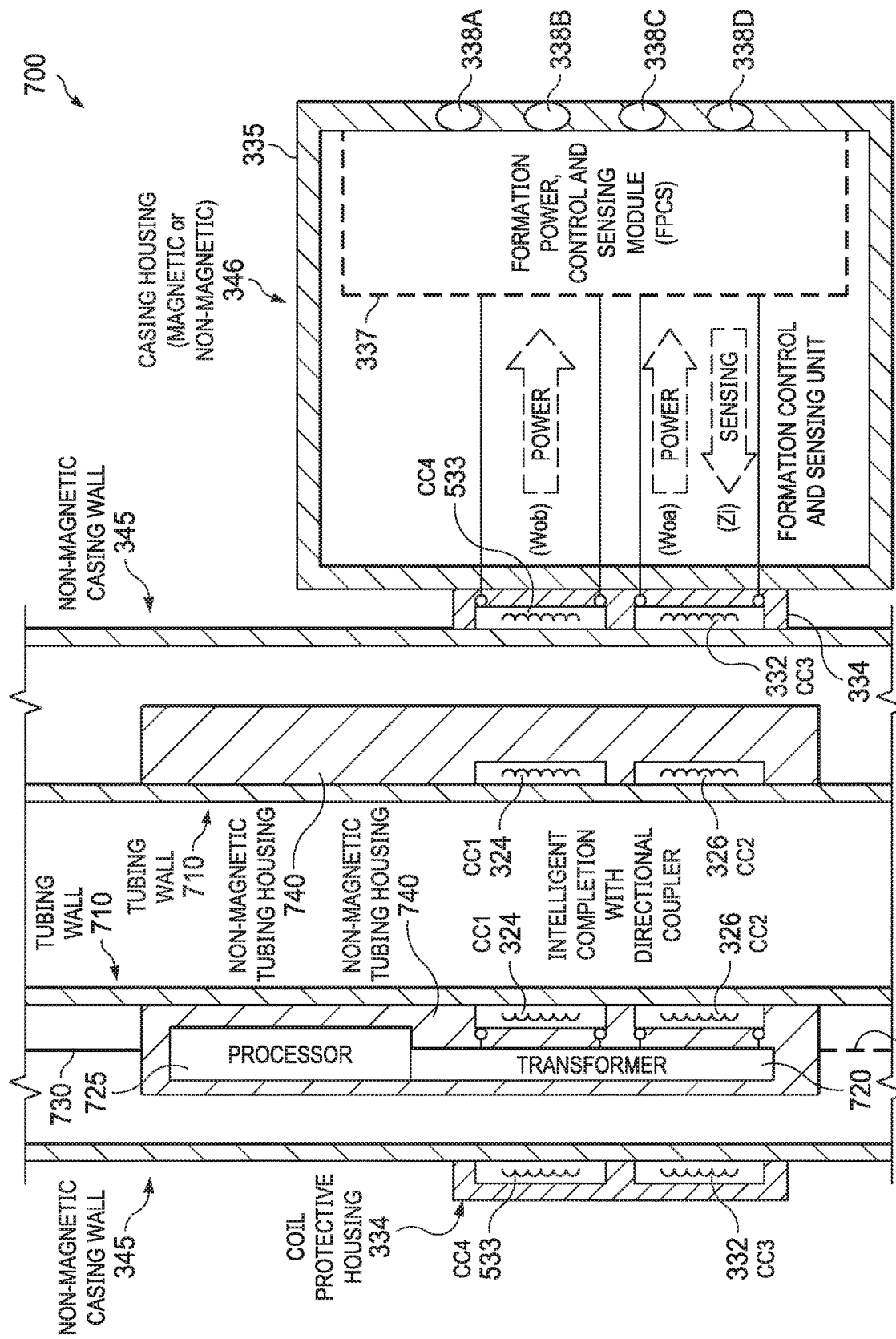
Figure 8:
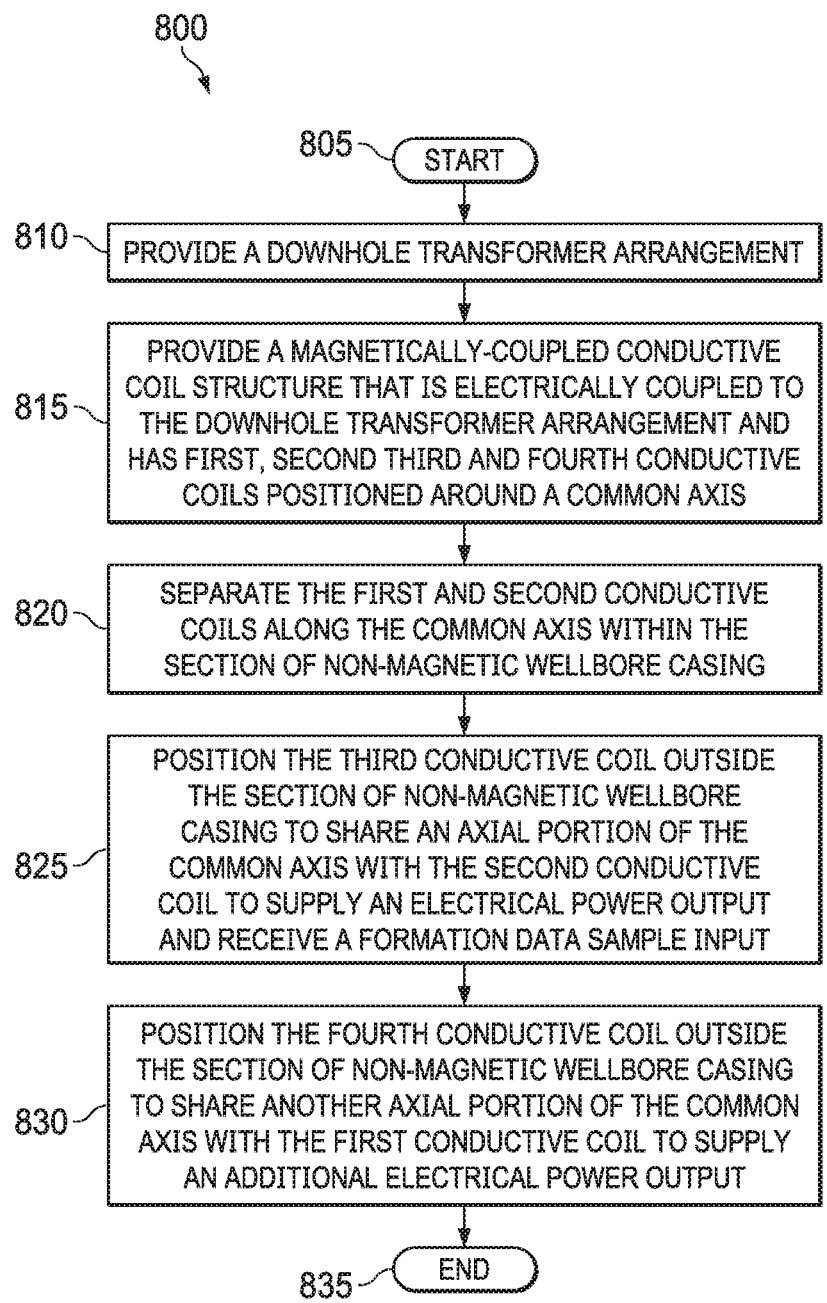

FIG. 7 illustrates an enhanced view of an embodiment of a downhole portion of an intelligent wellbore completion constructed according to the principles of the present disclosure FIG. 8 illustrates a flow diagram of an example of a method of employing a downhole directional coupling device in a wellbore having a section of non-magnetic casing carried out according to the principles of the present disclosure.

Herein, various examples are described more fully by the Figures and the Detailed Description. Nevertheless, the inventions may be embodied in various forms and are not limited to the examples described in the Figures and Detailed Description.

DETAILED DESCRIPTION

The description and drawings merely illustrate the principles of the disclosure. It will thus be appreciated that those skilled in the art will be able to devise various arrangements that, although not explicitly described or shown herein, embody the principles of the disclosure and are included within its scope. Furthermore, all examples recited herein are principally intended expressly to be for pedagogical purposes to aid the reader in understanding the principles of the disclosure and concepts contributed by the inventor to furthering the art, and are to be construed as being without limitation to such specifically recited examples and conditions. Moreover, all statements herein reciting principles and aspects of the disclosure, as well as specific examples thereof, are intended to encompass equivalents thereof. Additionally, the term, "or," as used herein, refers to a non-exclusive or, unless otherwise indicated.

The disclosure provide a means to directionally couple signals sent through a wellbore casing in order to enable a low frequency, low loss power transfer path in one direction along with allowing a concurrent higher speed data transfer path in the opposite direction. Additionally, harmonics on the low frequency path do not interfere with the higher speed channel, making square wave power transmission feasible. Another point is that there is no requirement for frequencies employed on each path to be harmonically related. The embodiments disclosed tend to be physically compact on a power transmission side while simple LC filters and/or capacitive coupling will typically be sufficient on a data transmission side.

The disclosure presents sizes and depicts separations of three conductive coils that are pictorial in nature to illustrate concepts generally necessary for proper operation of a downhole directional coupling device so constructed. In practice, their actual dimensions and separations are largely directed by their operating environment factors, which may include casing diameter and material, conductive coil requirements and wellbore fluid characteristics. For purposes of this disclosure, the term "casing" is defined as a generic term that includes "pipe", "conduit", "tubing", "coiled tubing" and "liner", for example.

Figure 6:
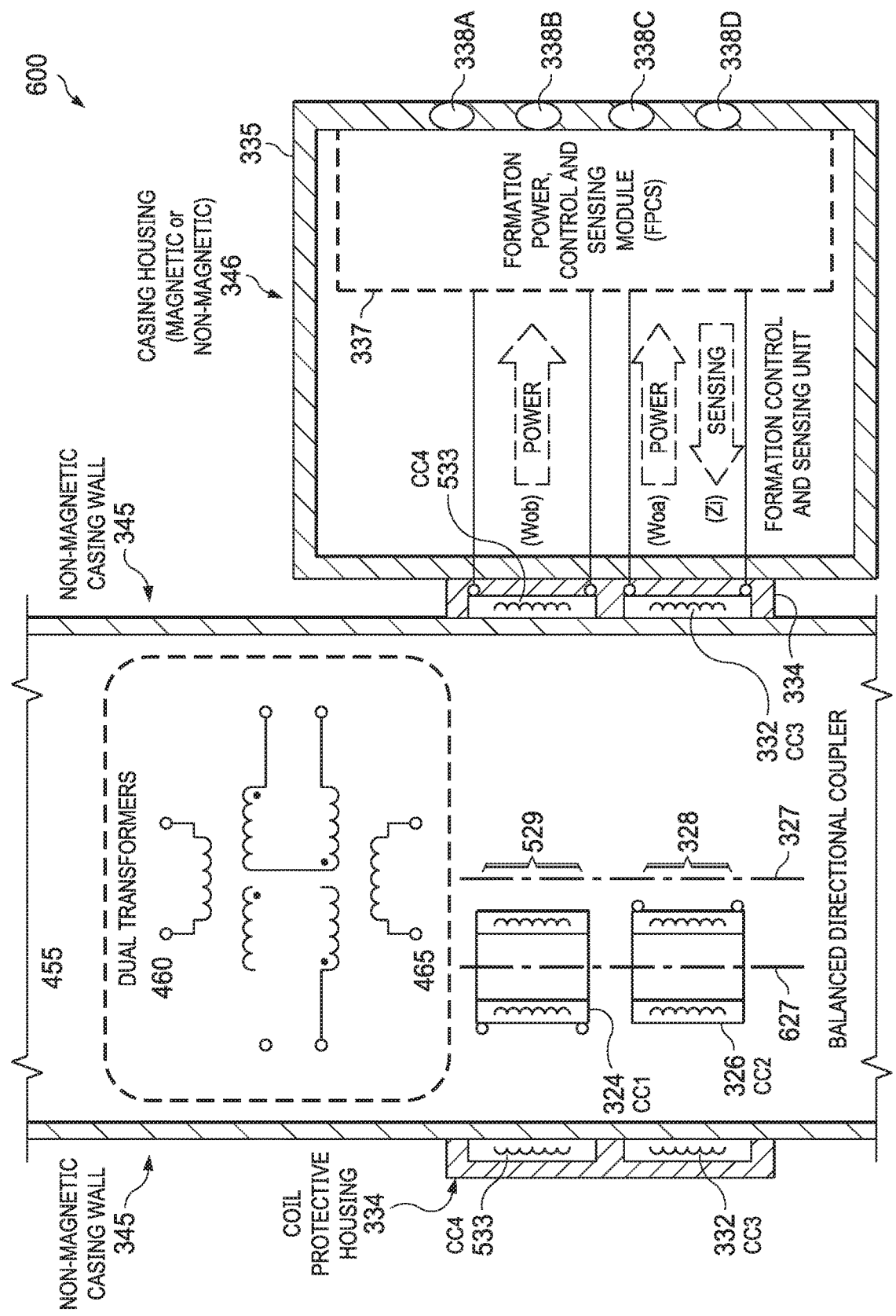
FIG. 6 illustrates an enhanced view of a downhole directional coupling device employing another example of a conductive coil structure having four conductive coils and constructed according to the principles of the present disclosure.

Additionally, "positioned around a common axis" includes being centered on a separate axis that is parallel to the common axis and does not require the conductive coils to be centered on the common axis. For example, first and second conductive coils can be centered on a separate axis that is parallel to the common axis. FIG. 6 illustrates a common axis and a separate axis that are parallel.

Figure 1:
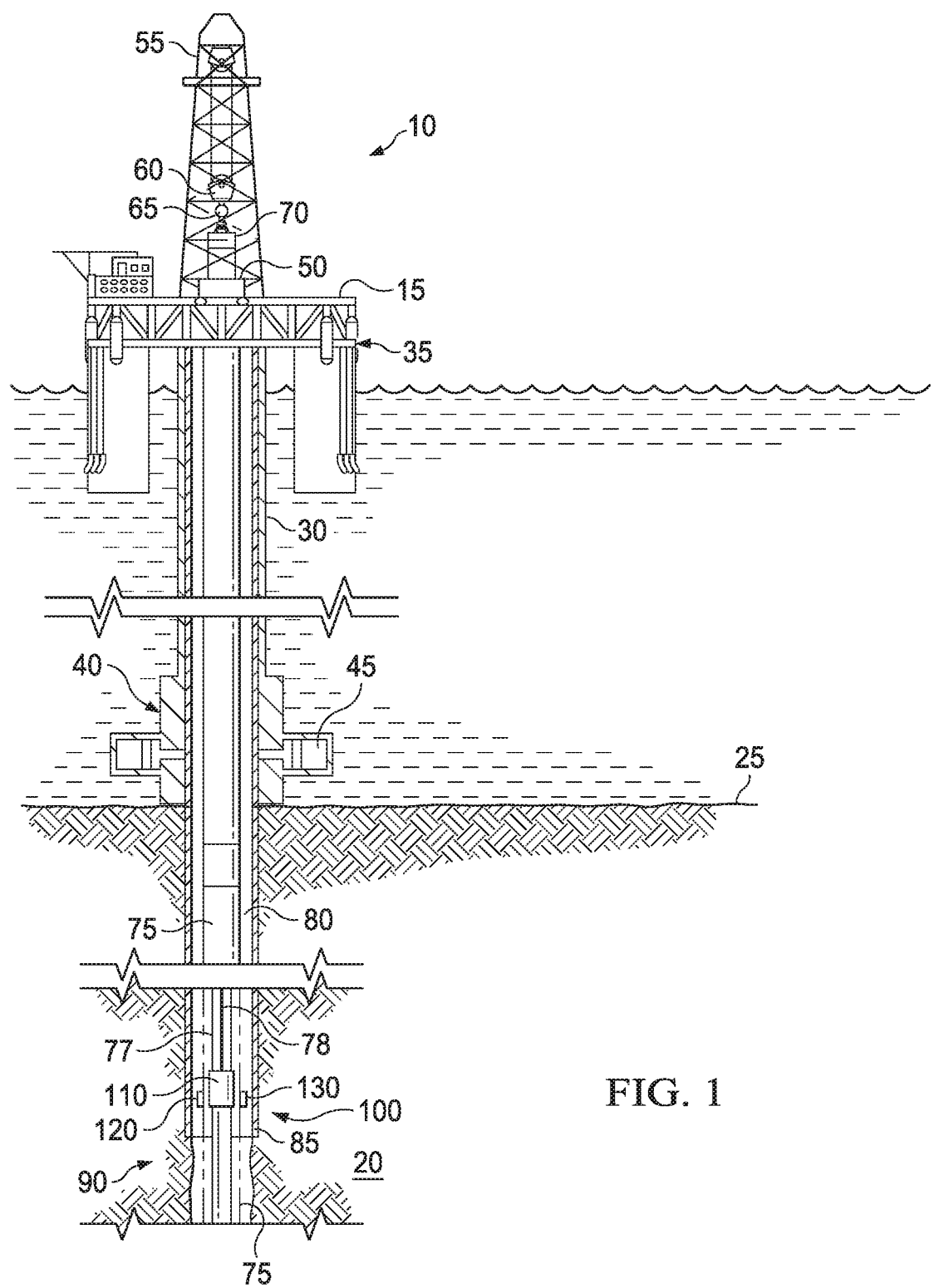
FIG. 1 illustrates a system diagram of an example well system having an intelligent completion system constructed according to the principles of the present disclosure.

FIG. 1 is a schematic illustration of an offshore oil and gas platform generally designated 10, operably coupled by way of example to an intelligent completion assembly. Such an intelligent completion assembly could alternatively be coupled to a semi-sub or a drill ship as well. Even though FIG. 1 depicts an offshore operation, one skilled in the art will understand that the apparatus according to the present disclosure is equally well suited for use in onshore operations. By way of convention in the following discussion, though FIG. 1 depicts a vertical wellbore, it should be understood by those skilled in the art that the apparatus according to the present disclosure is equally well suited for use in wellbores having other orientations including horizontal wellbores, slanted wellbores, multilateral wellbores or the like.

In the offshore oil and gas platform example of FIG. 1, a semi-submersible platform 15 can be positioned over a submerged oil and gas formation 20 located below a sea floor 25. A subsea conduit 30 may extend from a deck 35 of the platform 15 to a subsea wellhead installation 40, including blowout preventers 45. The platform 15 may have a hoisting apparatus 50, a derrick 55, a travel block 60, a hook 65, and a swivel 70 for raising and lowering pipe strings, such as a substantially tubular, axially extending production tubing 77. The production tubing 77 is located within a casing 75.

In FIG. 1, a wellbore 80 extends through the various earth strata including the formation 20, with a portion of the wellbore 80 having a casing string 85 cemented therein. Disposed in the wellbore 80 is an intelligent completion assembly 90. The intelligent completion assembly 90 includes a cased formation sampling tool 100 that is employed within a non-magnetic section of the casing 75. The cased formation sampling tool 100 can be one of the various examples of cased formation sampling tools disclosed in FIGS. 3 to 6. In FIG. 1, a downhole testing unit 110, a coil protective housing 120, a casing housing 130, and a communication link 78 are shown with respect to the intelligent completion assembly 90, the casing 75, and the production tubing 77. As illustrated in FIG. 1, the downhole testing unit 110 can be a functioning intelligent completion production string, i.e., production tubing 77. The intelligent completion assembly 90 can be a casing-based intelligent completion assembly and also include, for example, a lower completion assembly, that generally includes a hanger, sensors, inflow control devices, and packers (not shown in FIG. 1).

Figure 2:
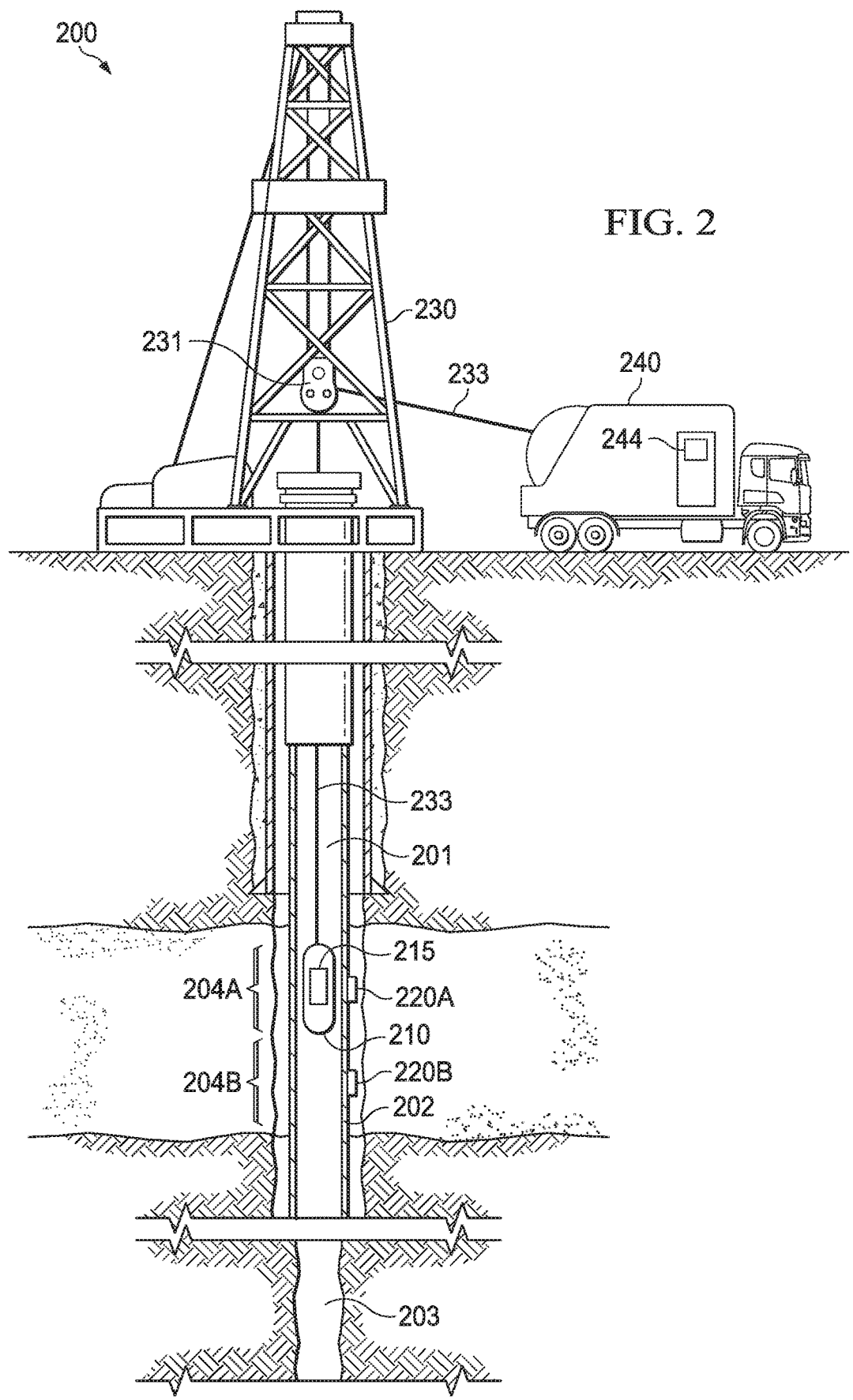
FIG. 2 illustrates an example of a wireline system constructed according to the principles of the present disclosure.

FIG. 2 illustrates an example of a wireline system, generally designated 200, constructed according to the principles of the present disclosure. The wireline system 200 is configured to perform formation testing and data sampling and includes a derrick 230 that supports a traveling block 231 and a wireline tool 210, such as a probe or a sonde that may be lowered by a wireline or logging cable 233 into a cased borehole 201 employing a casing 202. The wireline tool 210 forms part of a wireline logging operation.

Any data gathered by the wireline tool 210, such as from formation sensing units 220A, 220B, discussed below, can be communicated to a surface logging facility 240 for storage, processing, and/or analysis. The surface logging facility 240 may be provided with electronic equipment 244 including processors for various types of signal processing.

After drilling and casing of a wellbore is complete, it may be desirable to know ongoing formation characteristics by data sampling of cased formations through use of a cased formation sampling tool associated with the wireline tool 210 that employs a downhole testing unit 215 for use with one or more formation sensing units 220A, 220B. The downhole testing unit 215 is movable within the wellbore casing 202 under control of the wireline system 200, and each formation sensing unit 220A, 220B is fixed in position with respect to the wellbore casing 202. The downhole testing unit 215 may be positioned inside of the wellbore casing 202 to be proximate one of the formation sensing units 220A, 220B, which are located on the formation side of the wellbore casing 202. Sections 204A, 204B of the wellbore casing 202, located proximate each of the formation sensing units 220A, 220B, respectively employ non-magnetic casing material.

In the cased borehole 201, the downhole testing unit 215 may be positioned with a selected one of the formation sensing units 220A, 220B to form an alignment of components between the two. This arrangement forms a downhole directional coupling device. The downhole directional coupling device provides for sending a power supply waveform for operationally powering the selected formation sensing unit. Concurrently, the downhole directional coupling device also provides for receiving a sensing waveform from the selected formation sensing unit that includes specific formation parameter data collected by the activated and selected formation sensing unit. This formation parameter data is sent to the logging facility 240 via the wireline cable 233 for storage, processing, and/or analysis.

The following FIGS. 3-6 illustrate general concepts and examples of downhole directional coupling device concepts and provide those that may be included in the wireline tool 210. FIG. 7 further illustrates these general concepts applied specifically to an intelligent completion example. FIG. 8 provides a method of employing a downhole directional coupling device in a wellbore that is applicable to either.

In addition to the implementations of FIGS. 1 and 2, examples of the present disclosure may be employed with other implementations (e.g., a permanently installed installation powered by a tubing encased conductor (TEC) or a slickline with a battery pack) that allow positioning of a downhole testing unit and capturing of feedback data from a formation sensing unit.

Figure 3:
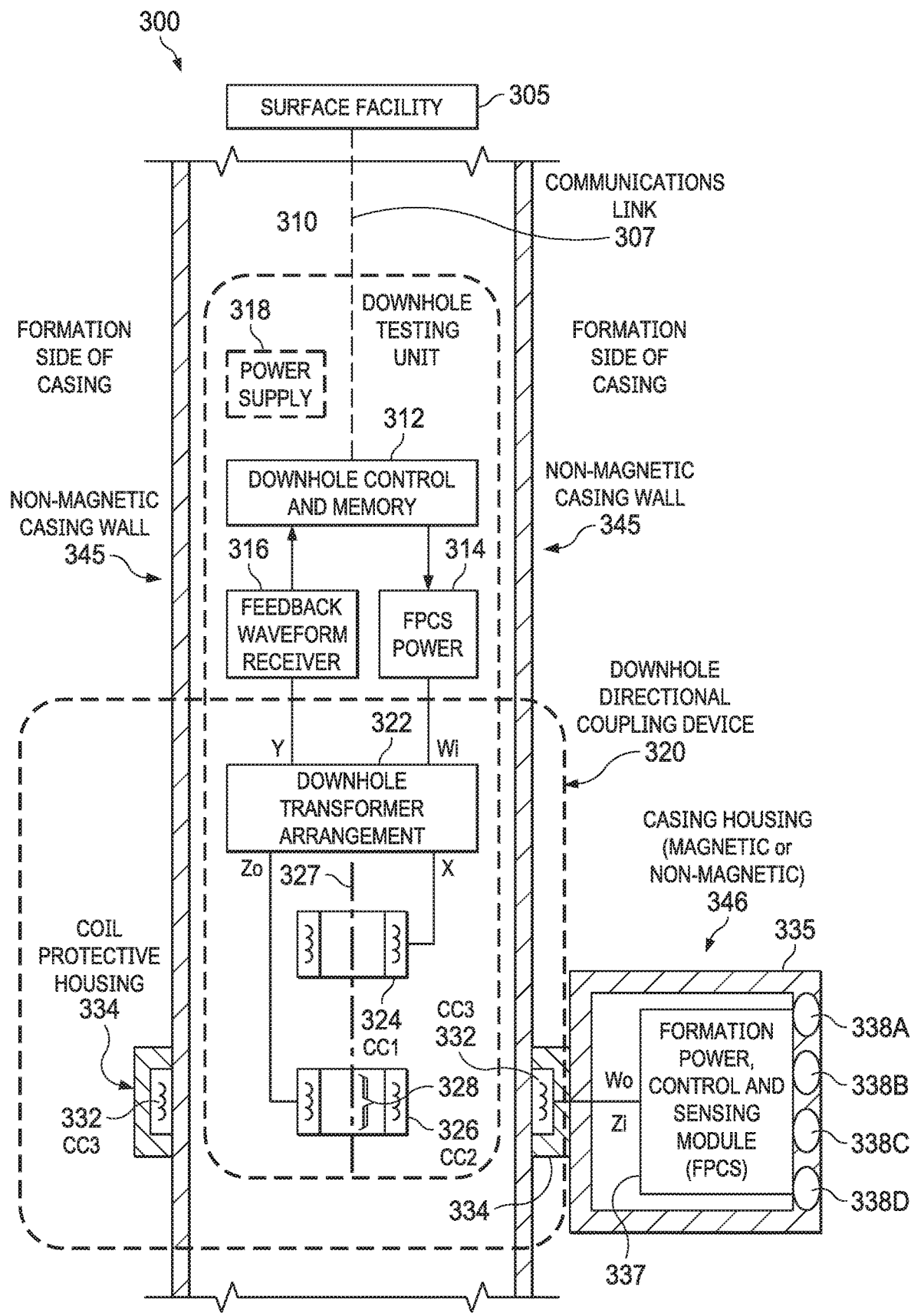
FIG. 3 illustrates an example of a cased formation sampling tool constructed according to the principles of the present disclosure.

FIG. 3 illustrates an example of a cased formation sampling tool, generally designated 300, constructed according to the principles of the present disclosure. The cased formation sampling tool 300 may be employed to obtain specific formation parameter data from a cased formation and interfaces with a surface facility 305 via a communications link 307, where the surface facility 305 and the communications link 307 may typically be those discussed with respect to the systems in FIG. 1 and FIG. 2. Generally, the surface facility 305 and the communications link 307 may be a facility and/or a mechanism that provides for positioning, powering and control of and communication with the cased formation sampling tool 300 for collecting specific formation parameter data information from a cased formation.

The cased formation sampling tool 300 is employed within a non-magnetic section of casing 345 and includes a downhole testing unit 310, a downhole directional coupling device 320 and a formation sensing unit 335 that is encased in a casing housing 346. The downhole testing unit 310 includes downhole control and optional memory 312, a formation sensing unit power waveform generator 314, a formation data feedback waveform receiver 316, and an auxiliary power supply 318. The downhole testing unit 310 also includes a wellbore portion of a downhole directional coupling device 320, having a downhole transformer arrangement 322 and first and second conductive coils 324, 326.

The downhole directional coupling device 320 additionally includes a formation portion of the downhole directional coupling device 320 in the form of a third conductive coil 332 that is constructed around the formation wall of the non-magnetic casing 345. The first, second and third conductive coils 327, 326, 332 are positioned around a common center axis 327, which corresponds to the centerline of the non-magnetic casing 345, in this example. In this example, the third conductive coil 332 is protected by a coil protective housing 334, although other embodiments may employ other coil protection schemes.

It may also be noted that only the section of casing 345 with the conductive coils needs to be non-magnetic. The remaining portion of a casing string can be any suitable material. Additionally, both the first and second conductive coils 324, 326 need to see the same cross section in the same material when operating.

The downhole testing unit 310 is positioned inside of the non-magnetic casing housing 345, which separates it from a portion of the downhole directional coupling device 320 and the formation sensing unit 335, as shown. The downhole testing unit 310 is generally positioned within a cased wellbore to be proximate the formation sensing unit 335 in order to supply power and receive formation data feedback from the formation sensing unit 335. A proper positioning of the downhole testing unit 310 within the non-magnetic casing 345 places the second conductive coil 326 within a wellbore cylindrical space defined by the cylindrical height and diameter of the third conductive coil 332, as shown. This positioning maximizes both the power and data transfer signals for the formation sensing unit 335. The formation sensing unit 335 includes a formation power, control and sensing module 337 and a plurality of formation data ports 338A-338D, as shown.

In the illustrated example, the downhole testing unit 310 receives its operating electrical power from the surface facility 305 via the communications link 307. The downhole control and optional memory 312 provides operational control of the downhole testing unit 310 and buffer memory for formation data samples generated by the formation sensing unit 335 and received from the downhole directional coupling device 320. The formation sensing unit power waveform generator 314 provides an input power waveform Wi for the formation sensing unit 335 that is conveyed through the downhole directional coupling device 320. The feedback waveform receiver 316 receives a sensor feedback waveform Y that represents a data measurement that is obtained by the formation sensing unit 335 and conveyed through the downhole directional coupling device 320. The auxiliary power supply 318 is a power supply that may be employed by the downhole testing unit 310 in other embodiments when surface power is unavailable.

The formation power, control and sensing module 337 provides operational power and control of the formation sensing unit 335. This operational power is derived from the input power waveform Wi previously indicated. Control of the formation sensing unit 335 provides for obtaining samples of specific formation parameter data samples from the plurality of formation sensors 338A-338D. These formation parameter data may include cased formation in-situ temperatures and pressures, data concerning actuators and data concerning motor systems, for example. These formation parameter data samples are returned via the sensor feedback waveform Y to the feedback waveform receiver 316. The formation parameter data samples may then be buffered temporarily in the downhole control and memory 312 before being sent to the surface facility 305 via the communications link 307.

Generally, the downhole directional coupling device 320 inputs a power waveform Wi and outputs a power waveform Wo representative of the input power waveform Wi across the third conductive coil 332 to provide operating power for the formation sensing unit 335. Concurrently, the formation power, control and sensing module 337 provides an input data waveform Zi across the third conductive coil 332 that results in an output data waveform Zo from the second conductive coil 326. The output data waveform Zo is representative of the input data waveform Zi and provides the sensor feedback waveform Y for the downhole directional coupling device 320.

The input power waveform Wi and the sensor feedback waveform Y typically have different operating frequencies. The power waveform Wi may be a lower frequency (for example 150 hertz) square wave that maximizes power transfer per cycle. Alternately, the sensor feedback waveform Y may typically be a higher frequency waveform (for example 1,000 hertz) that multiplexes data samples from the plurality of formation sensors 338A-338D.

The first, second and third conductive coils 324, 326, and 332 employ a common axis 327, where the second and third conductive coils 326, 332 have different radii and additionally share a same axis portion 328 of the common axis 327. A spacing of the first and second conductive coils 324, 326 along the common axis 327 and the shared axis portion 328 of the second and third conductive coils 326, 332 is critical to a proper operation of at least some of the embodiments for a downhole directional coupling device as discussed in this disclosure. This conductive coil structure provides for the first, second and third conductive coils 324, 326, and 332 to be magnetically coupled together in a manner that provides directional coupling of the power waveform Wi and the sensor feedback waveform Y. Additionally, the first and second conductive coils 324, 326 have substantially equal dimensions and operating characteristics to provide optimum operation of the downhole directional coupling device 320.

Generally, a magnetic flux generated by a conductive coil is directly proportional to an electric current flowing through the conductive coil and a number of coil windings carrying the electric current. Additionally, this magnetic flux is generated perpendicular to the electric current and forms a closed path through the conductive coil and surrounding the conductive coil. Inversely, an electric current generated (i.e. induced) in a conductive coil is directly proportional to a magnetic flux existing inside the conductive coil (i.e., magnetic induction).

In this example, a power magnetic flux corresponding to the power waveform Wi is generated by the first and second conductive coils 324, 326 working together in series to effectively add a majority of their individual magnetic fluxes, which is due to their proximity on the common axis 327. This resulting power magnetic flux also exists inside the third conductive coil 332 thereby generating the power waveform Wo proportional to the input power waveform Wi across the third conductive coil 332 to provide operating power for the formation sensing unit 335.

A data magnetic flux corresponding to the sensor feedback waveform Y (and the output data waveform Zo) is generated by applying the input data waveform Zi across the third conductive coil 332. This resulting data magnetic flux also exists inside the third conductive coil 332 and is coupled primarily to the second conductive coil 326 (due to sharing the same axis portion 328 and the axial separation from the first conductive coil 324) to generate the output data waveform Zo.

Generally, the first and second conductive coils 324, 326 are required to be employed in a same operating environment with regard to casing wall material and thickness for optimal operation.

Additionally, the first and second conductive coils 324, 326 can be separated along the common axis 327 as far as desired. Alternately, a minimum axil separation of the first and second conductive coils 324, 326 is required to be sufficient enough for the first and second conductive coils 324, 326 not to overlap Correspondingly, proper operation of the downhole directional coupling device 320 requires that the second and third conductive coils 326, 332 accommodate both power and data magnetic fluxes related to the power waveform Wi and the input data waveform Zi concurrently. These design considerations indicate that there is a balance to be struck in selecting conductive coil design parameters and separations for optimal downhole directional coupling of the power and data waveforms.

Figure 4A:
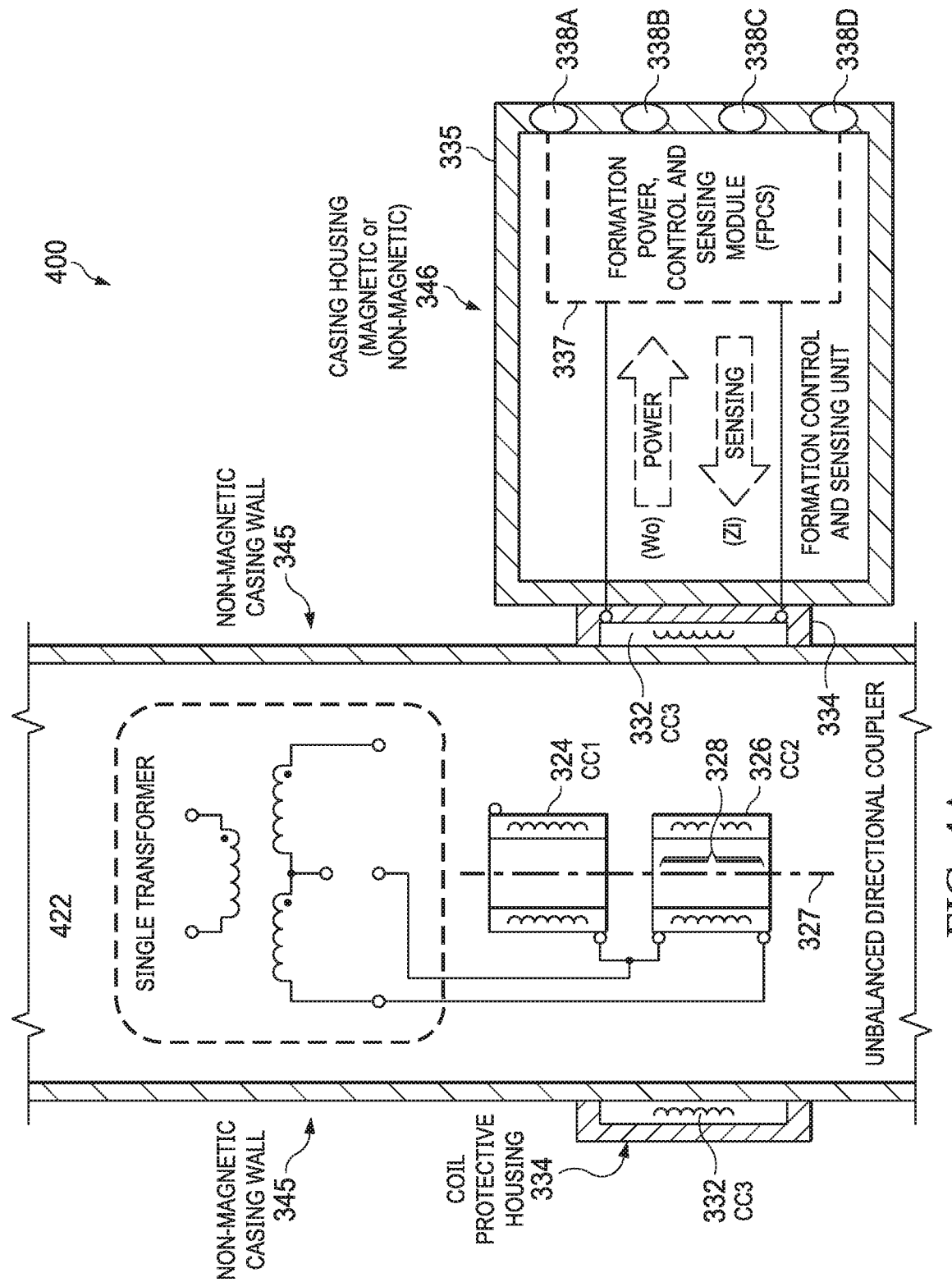
FIGS. 4A and 4B illustrate enhanced views of downhole directional coupling devices constructed according to the principles of the present disclosure.
Figure 4B:
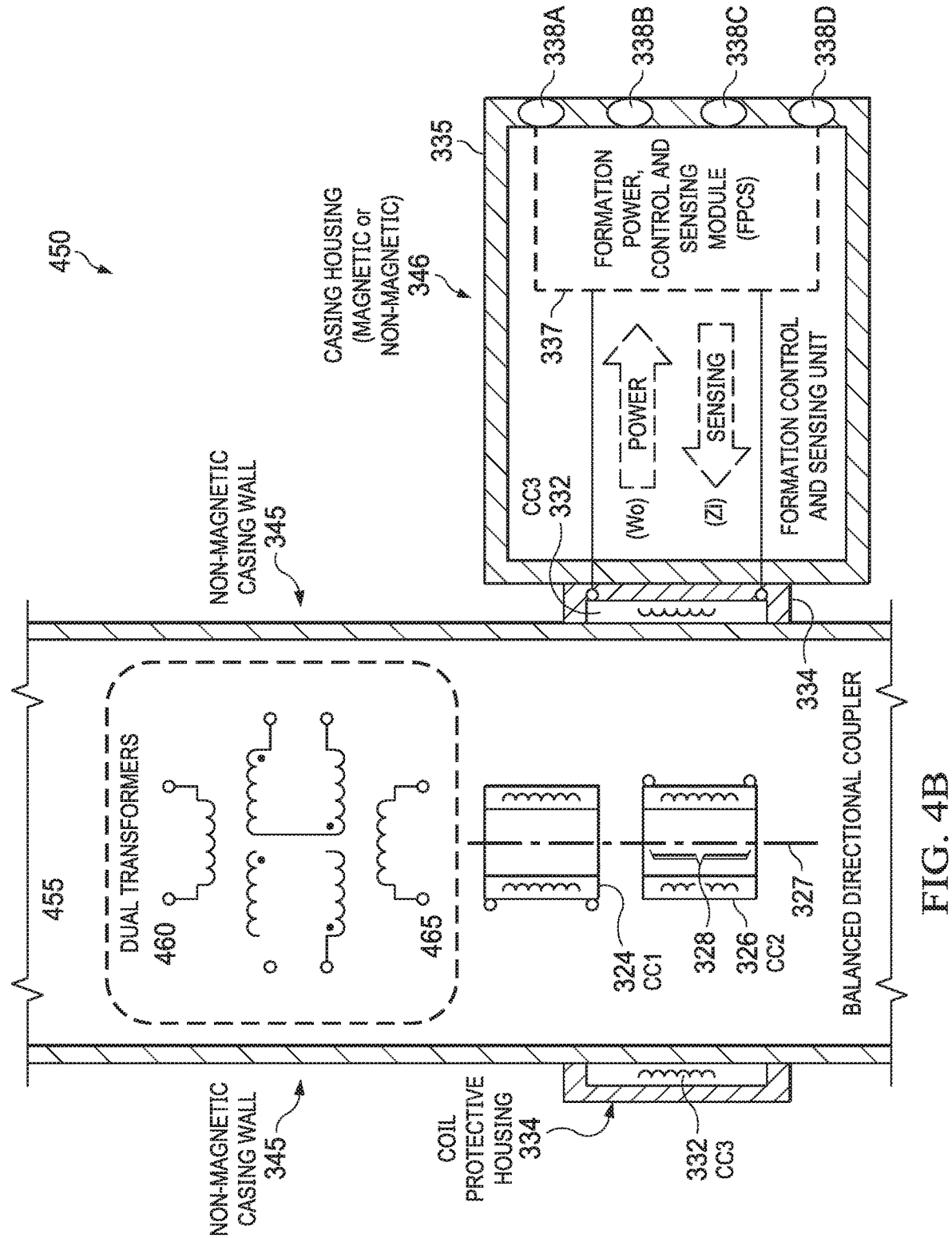

FIGS. 4A and 4B illustrate enhanced views of downhole directional coupling devices, generally designated 400 and 450, constructed according to the principles of the present disclosure. FIG. 4A employs a single transformer (unbalanced) directional coupler 400, and FIG. 4B employs a dual transformer (balanced) directional coupler 450.

The unbalanced downhole directional coupler 400 includes a single transformer 422 that is electrically coupled to first and second conductive coils 324, 326, as shown. The first and second conductive coils 324, 326 are not required to be mutually magnetically coupled through their axial alignment around the common axis 327. However, their connections to the single transformer 422 allow a voltage corresponding to an input power waveform Wi to be applied across both of them in series. The input power waveform Wi is conveyed through the third conductive coil 332, which shares the common axis 327, to provide an output power waveform Wo across terminals of the third conductive coil 332. However, the three conductive coil structure wastes about 50 percent of the generated power. The output power waveform Wo is used to provide operating power to the formation sensing unit 335, which employs the formation power, control and sensing module 337 and the plurality of formation data ports 338A-338D to collect formation data.

Concurrently, an input data waveform Zi from the formation sensing unit 335 is also electrically coupled to the terminals of the third conductive coil 332 to provide data samples from the formation sensing unit 335. The third conductive coil 332 is magnetically coupled primarily to the second conductive coil 326 thereby resulting in an output data waveform Zo across the second conductive coil 326, which contains the data samples from the formation sensing unit 335.

The single transformer (unbalanced) directional coupler 400 is electrically coupled to the input power waveform Wi, the output data waveform Zo and a first conductive coil voltage X, as shown, and generates a sensor feedback waveform Y that contains a representation of the data samples from the formation sensing unit 335. This transformer arrangement provides proper directing of the input power waveform Wi while independently receiving the sensor feedback waveform Y representing the data samples.

For example, assume that the single transformer 422 has a center-tapped secondary winding having twice as many turns as its primary winding. Additionally assume that the first and second conductive coils 324, 326 are identical in their parameters and characteristics and formation data samples are not being received at the moment. These conditions provide equal voltages of the same polarity across the first and second conductive coils that are equal to a voltage generated by the input power waveform Wi. Both terminals associated with the sensor feedback waveform Y are at the same potential (i.e., zero volts) indicating that there are no data samples being received while the input power waveform Wi is generating an out power waveform Wo across the third conductive coil 332.

Now assume that an input data waveform Zi is additionally applied across the third conductive coil 332 indicating that data samples are being sent. This action generates an output data waveform Zo across the second conductive coil 326 that is superimposed onto the voltage generated by the input power waveform Wi. This condition causes the non-center tap terminal to move in response to the output data waveform Zo and provides the sensor feedback waveform Y between the two indicated terminals.

In FIG. 4B, the dual transformer (balanced) directional coupler 450 includes an example of a dual transformer structure 455 wherein a first transformer 460 has the input power waveform Wi applied to its primary winding, and a second transformer 465 provides the sensor feedback waveform Y from its primary winding, as shown. For example, assume that the first and second transformers 460, 465 are identical with two secondary windings, where each secondary winding and each primary winding have a same number of turns. Additionally assume that the first and second conductive coils 324, 326 are identical in their parameters and characteristics and formation data samples are not being processed at the moment.

These conditions provide equal voltages having the same polarity across the first and second conductive coils 324, 326 that are equal to a voltage generated by the input power waveform Wi. Secondary currents in the first transformer 460 are equal and flowing in the same direction while secondary currents in the second transformer 465 are also equal and flowing in opposite directions thereby causing its primary voltage (representative of a sensor feedback waveform Y) to be zero, as it should be. As before, a power magnetic field created by the alignment of the first and second conductive coils 324, 326, their electrical connections and the input power waveform Wi is strongly conveyed through the third conductive coil 332, which shares the common axis 327, to provide an output power waveform Wo across terminals of the third conductive coil 332.

Now assume that an input data waveform Zi is additionally applied across the third conductive coil 332 indicating that data samples are being sent. This action generates a data magnetic field that results in an output data waveform Zo across the second conductive coil 326 that is superimposed onto the voltage generated by the input power waveform Wi. This condition alters the secondary currents flowing in the first and second transformers 460, 465 thereby generating a voltage representation of the sensor feedback waveform Y in the second transformer 465.

Figure 5:
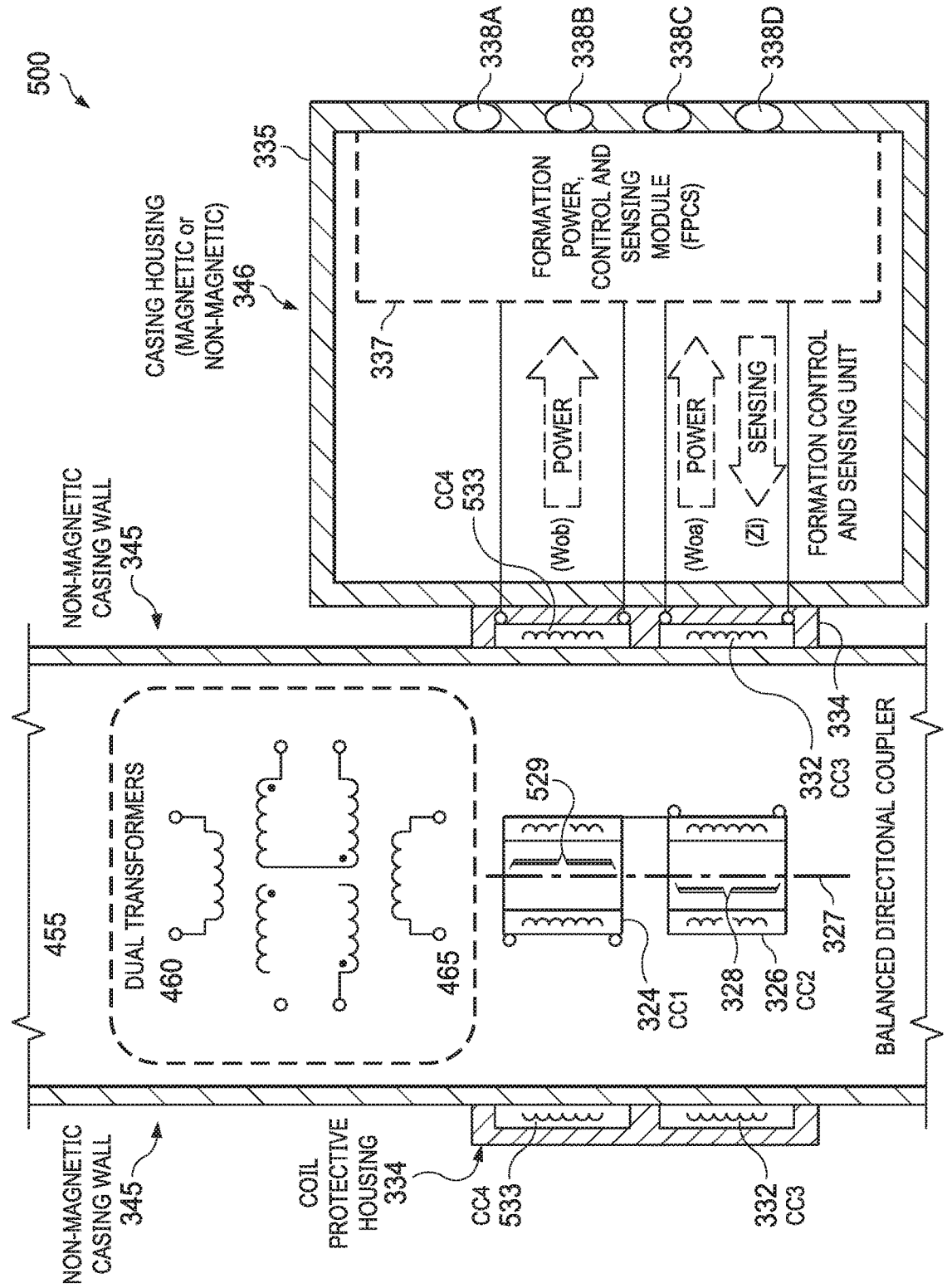
FIG. 5 illustrates an enhanced view of a downhole directional coupling device employing another example of a conductive coil structure having four conductive coils and constructed according to the principles of the present disclosure.

FIG. 5 illustrates an enhanced view of a downhole directional coupling device employing another example of a conductive coil structure having four conductive coils, generally designated 500, and constructed according to the principles of the present disclosure. Here, a balanced directional coupler using two transformers is employed, as an example, but an unbalanced directional coupler using a single transformer may also be employed.

The four conductive coil structure employs first, second, third and fourth conductive coils 324, 326, 332, 533, respectively, where the fourth conductive coil 533 is positioned on the formation side of the section of non-magnetic casing 345, as shown. In this example, the fourth conductive coil 533 is positioned to share an axial portion 529 of the common axis 327 with the first conductive coil 324, while the third conductive coil 332 remains positioned to share an axial portion 328 of the common axis 327 with the second conductive coil 326, as before.

This addition and positioning of the fourth conductive coil 533 substantially doubles the power generating capability for the formation sensing unit 335 compared to a three conductive coil structure, when the third and fourth conductive coils 332, 533 are substantially identical and they operate in the same environment. When achieved, this arrangement also ensures a much greater balance on the load experienced by the first and second conductive coils 324, 326 thereby allowing weaker sensing signals to be recovered. However, this performance improvement comes at a tradeoff of having a reduced "zone of contact" between respective coil pairs, since only one specific alignment of the four conductive coil structure allows operation.

In FIG. 5, the formation power, control and sensing module 337 accepts a first output power Woa from the third conductive coil 332 and a second output power Wob from the fourth conductive coil 533 and combines these two into its required voltages. The fourth conductive coil 533 does not have any formation sensing data from the formation sensing unit 335 applied to it and, for example, is only employed to increase power supplied to the formation sensing unit 335. The third conductive coil 332 continues to receive formation sensing data from the formation sensing unit 335 and apply it as before.

FIG. 6 illustrates an enhanced view of a downhole directional coupling device employing another example of a conductive coil structure having four conductive coils, generally designated 600, and constructed according to the principles of the present disclosure. Here, a balanced directional coupler using two transformers is again employed, as an example, but an unbalanced directional coupler using a single transformer may also be employed.

This four conductive coil structure builds on and extends a three conductive coil structure as has been discussed in previous examples. In this example, it may be observed that first and second conductive coils 324, 326 remain coaxial with one another inside the section of non-magnetic wellbore casing 345 employing a separate axis 627. The third and fourth conductive coils also remain coaxial with one another outside the section of non-magnetic wellbore casing 345 employing the common axis 327. The first and second conductive coils 324, 326 share the separate axis 627 and have been offset from the common axis 327, as shown, where the separate axis 627 is parallel to the common axis 327. It may also be observed that the axial position 529 of the first and fourth conductive coils 324, 533 and the axial position 328 of the second and third conductive coils 326, 332 have been maintained.

Operational characteristics of this dual axis embodiment of the conductive coil structure 600 closely reflect that of common axis structures discussed previously. As discussed with respect to FIG. 5, the formation power, control and sensing module 337 accepts a first output power Woa from the third conductive coil 332 and a second output power Wob from the fourth conductive coil 533 and combines these two into its required voltages. The fourth conductive coil 533 does not have any formation sensing data from the formation sensing unit 335 applied to it and, for example, is only employed to increase power supplied to the formation sensing unit 335. The third conductive coil 332 continues to receive formation sensing data from the formation sensing unit 335 and apply it as before.

FIG. 7 illustrates an enhanced view of an embodiment of a downhole portion of an intelligent wellbore completion, generally designated 700, constructed according to the principles of the present disclosure. The intelligent completion downhole portion 700 includes a conductive coil structure having four conductive coils as discussed in FIGS. 5 and 6 and may be employed in the intelligent completion system of FIG. 1. It may also be noted that a conductive coil structure employing only three conductive coils can be constructed, as was discussed in FIGS. 3, 4A and 4B.

In this embodiment, a production tubing string is placed inside of a last casing string that supports the formation sensing unit 335, as before. The third and fourth conductive coils 332, 533 are mounted on the outside of the non-magnetic casing wall 345 and are electrically coupled to the formation sensing unit 335, as before. The first and second conductive coils 324, 326 are mounted on the outside of a tubing wall 710 thereby placing them in an annulus between the tubing and the casing, as shown. A transformer arrangement 720 employs a single transformer (unbalanced) or dual transformers (balanced) to provide a downhole directional coupler with the first and second conductive coils 324, 326, as discussed before. A processor 725 is electrically coupled to the transformer arrangement 720, an upper communications link 730 and a lower communication link 735, if applicable. A non-magnetic tubing housing 740 physically protects the first and second conductive coils 324, 326, the transformer arrangement 720 and the processor 725.

Operation of this downhole directional coupler employing four conductive coils parallels that of FIG. 5 above. The transformer arrangement 720 receives an input power waveform Wi from the processor 725 and provides output power waveforms Woa, Wob through the conductive coil structure to the formation sensing unit 335, as shown. Correspondingly, the formation sensing unit 335 provides input data samples Zi to the conductive coil structure that are conveyed through the transformer arrangement 720 to the processor 725 for transmission over the upper communications link 730 to surface equipment.

That is, formation samples from the formation sensing unit 335 are conveyed through the conductive coil structure and the transformer arrangement 720 (i.e., the downhole directional coupler) to the processor 725, which then prepares them for transmission to the surface equipment via the upper communications link 730. The upper communications link 730 may be a single transmission cable or include multiple transmission cables and may employ electrical signaling, optical signaling or both. When additional intelligent completion downhole portions are employed further down the wellbore, the lower communication link 735 is employed to convey these samples to the surface equipment. Depending on the number of transmission cables employed in the upper and lower communication links 730, 735 and sample modulation schemes employed, the processor 725 may take part in this action or focus solely on samples originating from the formation sensing unit 335.

FIG. 8 illustrates a flow diagram of an example of a method of employing a downhole directional coupling device in a wellbore having a section of non-magnetic casing, generally designated 800, carried out according to the principles of the present disclosure.

The method 800 starts in a step 805, and a downhole transformer arrangement is provided in a step 810 Then, a magnetically-coupled conductive coil structure is provided that is electrically coupled to the downhole transformer arrangement and has first, second, third and fourth conductive coils positioned around a common axis, in a step 815. The first and second conductive coils are separated along the common axis within the section of non-magnetic wellbore casing, in a step 820. The third conductive coil is positioned outside the section of non-magnetic wellbore casing and to share an axial portion of the common axis with the second conductive coil, in a step 825. A fourth conductive coil is positioned outside the section of non-magnetic wellbore casing to share another axial portion of the common axis with the first conductive coil to supply an additional electric power outlet.

In one example, the downhole transformer arrangement employs a single transformer in an unbalanced directional coupler or alternately, it may employ dual transformers in a balanced directional coupler. In another example, an input power waveform is generated and supplied to the downhole transformer arrangement to provide an output power waveform across the third conductive coil and an additional output power waveform across the fourth conductive coil. In an additional example, an input data waveform is generated across the third conductive coil to provide an output data waveform from the downhole transformer arrangement. The method 800 ends in a step 835.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order and/or the grouping of the steps are not limitations of the present disclosure.

Those skilled in the art to which this application relates will appreciate that other and further additions, deletions, substitutions and modifications may be made to the described embodiments.

Aspects disclosed herein include:

A. A downhole directional coupling device for use with a non-magnetic section of wellbore casing, including a downhole transformer arrangement having at least one transformer and a magnetically-coupled conductive coil structure that is electrically coupled to the downhole transformer arrangement and has first, second and third conductive coils positioned around a common axis, wherein the first and second conductive coils are separated along the common axis and located inside the section of non-magnetic wellbore casing, and the third conductive coil shares an axial portion of the common axis with the second conductive coil and is located outside the section of non-magnetic wellbore casing.

B. A method of employing a downhole directional coupling device in a wellbore having a section of non-magnetic casing, including providing a downhole transformer arrangement, providing a magnetically-coupled conductive coil structure that is electrically coupled to the downhole transformer arrangement and has first, second and third conductive coils positioned around a common axis, separating the first and second conductive coils along the common axis within the section of non-magnetic wellbore casing, and positioning the third conductive coil outside the section of non-magnetic wellbore casing and to share an axial portion of the common axis with the second conductive coil.

C. A system, including Surface equipment that is electrically coupled to a communications link to provide operational support downlink and receive formation information uplink and a downhole directional coupling device electrically coupled to the communications link having a downhole transformer arrangement with at least one transformer and a magnetically-coupled conductive coil structure that is electrically coupled to the downhole transformer arrangement and has first, second and third conductive coils positioned around a common axis, wherein the first and second conductive coils are separated along the common axis and located inside the section of non-magnetic wellbore casing and the third conductive coil shares an axial portion of the common axis with the second conductive coil and is located outside the section of non-magnetic wellbore casing.

Each of the foregoing aspects A, B, and C, may comprise one or more of the following additional elements singly or in combination, and neither the example embodiments or the following listed elements limit the disclosure, but are provided as examples of the various embodiments covered by the disclosure:

Element 1: further comprising the magnetically-coupled conductive coil structure having a fourth conductive coil located outside the section of non-magnetic wellbore casing that shares another axial portion of the common axis with the first conductive coil and having an additional output power waveform across the fourth conductive coil. Element 2: wherein the first and second conductive coils share a separate axis that is parallel to the common axis and the third conductive coil occupies an axial position on the common axis that is aligned with the second conductive coil on the separate axis. Element 3: wherein the magnetically-coupled conductive coil structure further includes a fourth conductive coil that is located outside the section of non-magnetic wellbore casing and shares the common axis with the third conductive coil. Element 4: wherein the fourth conductive coil occupies an axial position on the common axis that is aligned with the first conductive coil on the separate axis and has an additional output power waveform across the fourth conductive coil. Element 5: wherein the common axis is the central axis of the wellbore casing. Element 6: wherein the downhole transformer arrangement employs a single transformer in an unbalanced directional coupler or dual transformers in a balanced directional coupler. Element 7: wherein an input power waveform to the downhole transformer arrangement provides an output power waveform across the third conductive coil and an input data waveform across the third conductive coil provides an output data waveform from the downhole transformer arrangement. Element 8: wherein the input and output power waveforms for sensing formation parameters have different operating frequencies from the input and output data waveforms that provide specific formation parameter data. Element 9: further comprising positioning a fourth conductive coil in the magnetically-coupled conductive coil structure outside the section of non-magnetic wellbore casing to share another axial portion of the common axis with the first conductive coil to provide an additional output power waveform across the fourth conductive coil that is representative of an input power waveform applied to the downhole transformer arrangement. Element 10: wherein providing the downhole transformer arrangement employs a single transformer in an unbalanced directional coupler or dual transformers in a balanced directional coupler. Element 11: further comprising generating an input power waveform for the downhole transformer arrangement that provides an output power waveform across the third conductive coil. Element 12: further comprising generating an input data waveform across the third conductive coil that provides an output data waveform from the downhole transformer arrangement. Element 13: further comprising the magnetically-coupled conductive coil structure having a fourth conductive coil located outside the section of non-magnetic wellbore casing that shares another axial portion of the common axis with the first conductive coil and having an additional output power waveform across the fourth conductive coil that is representative of an input power waveform applied to the downhole transformer arrangement. Element 14: further comprising a formation power, control and sensing module electrically coupled to the third conductive coil that samples formation parameter data to convey through the downhole directional coupling device to the surface equipment via the communications link. Element 15: wherein the downhole transformer arrangement employs a single transformer in an unbalanced directional coupler or dual transformers in a balanced directional coupler. Element 16: wherein an input power waveform to the downhole transformer arrangement provides an output power waveform across the third conductive coil and an input data waveform across the third conductive coil provides an output data waveform from the downhole transformer arrangement. Element 17: wherein the output power waveform corresponds to a first magnetic coupling from the second conductive coil to the third conductive coil and the output data waveform corresponds to a second magnetic coupling from the third conductive coil to the second conductive coil. Element 18: wherein the input and output power waveforms have different operating frequencies from the input and output data waveforms. Element 19: further comprising the magnetically-coupled conductive coil structure having first, second, third and fourth conductive coils positioned around a common axis, wherein the first and second conductive coils are separated along the common axis and are located outside a section of wellbore tubing of an intelligent completion system, and wherein the third and fourth conductive coils are located outside a section of non-magnetic wellbore casing of the intelligent completion system surrounding the non-magnetic wellbore tubing and respectively share an axial portion of the common axis with the first and second conductive coils.

What is claimed is:

1. A downhole directional coupling device for use with a non-magnetic section of wellbore casing, comprising:
a downhole transformer arrangement having at least one transformer; and
a magnetically-coupled conductive coil structure that is electrically coupled to the downhole transformer arrangement and has first, second and third conductive coils positioned around a common axis,
wherein the first and second conductive coils are separated along the common axis and located inside the section of non-magnetic wellbore casing, the third conductive coil shares an axial portion of the common axis with the second conductive coil, and the third conductive coil is located outside the section of non-magnetic wellbore casing,
wherein an input power waveform to the downhole transformer arrangement provides an output power waveform across the third conductive coil and an input data waveform across the third conductive coil provides an output data waveform from the downhole transformer arrangement.

2. The coupling device as recited in claim 1 further comprising the magnetically-coupled conductive coil structure having a fourth conductive coil located outside the section of non-magnetic wellbore casing that shares another axial portion of the common axis with the first conductive coil and having an additional output power waveform across the fourth conductive coil.

3. The coupling device as recited in claim 1 wherein the first and second conductive coils share a separate axis that is parallel to the common axis, and the third conductive coil occupies an axial position on the common axis that is aligned with the second conductive coil on the separate axis.

4. The coupling device as recited in claim 3 wherein the magnetically-coupled conductive coil structure further comprises a fourth conductive coil that is located outside the section of non-magnetic wellbore casing and shares the common axis with the third conductive coil, and wherein the fourth conductive coil occupies an axial position on the common axis that is aligned with the first conductive coil on the separate axis and has an additional output power waveform across the fourth conductive coil.

5. The coupling device as recited in claim 1, wherein the common axis is the central axis of the wellbore casing.

6. The coupling device as recited in claim 1, wherein the downhole transformer arrangement employs a single transformer in an unbalanced directional coupler or dual transformers in a balanced directional coupler.

7. The coupling device as recited in claim 1 wherein the input and output power waveforms for sensing formation parameters have different operating frequencies from the input and output data waveforms that provide specific formation parameter data.

8. A method of employing a downhole directional coupling device in a wellbore having a section of non-magnetic casing, comprising:
providing a downhole transformer arrangement;
providing a magnetically-coupled conductive coil structure that is electrically coupled to the downhole transformer arrangement and has first, second and third conductive coils positioned around a common axis;
separating the first and second conductive coils along the common axis within the section of non-magnetic wellbore casing;
positioning the third conductive coil outside the section of non-magnetic wellbore casing and to share an axial portion of the common axis with the second conductive coil;
generating an input power waveform for the downhole transformer arrangement that provides an output power waveform across the third conductive coil; and
generating an input data waveform across the third conductive coil that provides an output data waveform from the downhole transformer arrangement.

9. The method as recited in claim 8 further comprising positioning a fourth conductive coil in the magnetically-coupled conductive coil structure outside the section of non-magnetic wellbore casing to share another axial portion of the common axis with the first conductive coil to provide an additional output power waveform across the fourth conductive coil that is representative of an input power waveform applied to the downhole transformer arrangement.

10. The method as recited in claim 8 wherein providing the downhole transformer arrangement employs a single transformer in an unbalanced directional coupler or dual transformers in a balanced directional coupler.

11. A system, comprising:
surface equipment that is electrically coupled to a communications link to provide operational support downlink and receive formation information uplink; and
a downhole directional coupling device electrically coupled to the communications link, including:
a downhole transformer arrangement having at least one transformer, and
a magnetically-coupled conductive coil structure that is electrically coupled to the downhole transformer arrangement and has first, second and third conductive coils positioned around a common axis,
wherein the first and second conductive coils are separated along the common axis and located inside the section of non-magnetic wellbore casing, the third conductive coil shares an axial portion of the common axis with the second conductive coil, and the third conductive coil is located outside the section of non-magnetic wellbore casing,
wherein an input power waveform to the downhole transformer arrangement provides an output power waveform across the third conductive coil and an input data waveform across the third conductive coil provides an output data waveform from the downhole transformer arrangement.

12. The system as recited in claim 11 further comprising the magnetically-coupled conductive coil structure having a fourth conductive coil located outside the section of non-magnetic wellbore casing that shares another axial portion of the common axis with the first conductive coil and having an additional output power waveform across the fourth conductive coil that is representative of an input power waveform applied to the downhole transformer arrangement.

13. The system as recited in claim 11 further comprising a formation power, control and sensing module electrically coupled to the third conductive coil that samples formation parameter data to convey through the downhole directional coupling device to the surface equipment via the communications link.

14. The system as recited in claim 11 wherein the downhole transformer arrangement employs a single transformer in an unbalanced directional coupler or dual transformers in a balanced directional coupler.

15. The system as recited in claim 11 wherein the output power waveform corresponds to a first magnetic coupling from the second conductive coil to the third conductive coil and the output data waveform corresponds to a second magnetic coupling from the third conductive coil to the second conductive coil.

16. The system as recited in claim 11 wherein the input and output power waveforms have different operating frequencies from the input and output data waveforms.

17. The system as recited in claim 11 further comprising the magnetically-coupled conductive coil structure having first, second, third and fourth conductive coils positioned around a common axis,
wherein the first and second conductive coils are separated along the common axis and are located outside a section of wellbore tubing of an intelligent completion system, and
wherein the third and fourth conductive coils are located outside a section of non-magnetic wellbore casing of the intelligent completion system surrounding the non-magnetic wellbore tubing and respectively share an axial portion of the common axis with the first and second conductive coils.

* * * * *